US011615336B2

(12) United States Patent
Oliver et al.

(10) Patent No.: US 11,615,336 B2
(45) Date of Patent: Mar. 28, 2023

(54) CANCELLATION OF UNWANTED INTERACTIONS IN A SUPERCONDUCTING QUANTUM ARCHITECTURE

(71) Applicants: Massachusetts Institute of Technology, Cambridge, MA (US); SOCPRA SCIENCES ET GENIE S.E.C., Sherbrooke (CA)

(72) Inventors: William D. Oliver, Arlington, MA (US); Simon Gustavsson, Cambridge, MA (US); Roni Winik, Somerville, MA (US); Catherine Leroux, Sainte Julie (CA); Agustin Di Paolo, Sherbrooke (CA); Alexandre Blais, Sherbrooke (CA)

(73) Assignee: Massachusetts Institute of Technology, Cambridge, MA (US)

( * ) Notice: Subject to any disclaimer, the term of this patent is extended or adjusted under 35 U.S.C. 154(b) by 51 days.

(21) Appl. No.: 17/188,461

(22) Filed: Mar. 1, 2021

(65) Prior Publication Data
US 2021/0272008 A1     Sep. 2, 2021

Related U.S. Application Data

(60) Provisional application No. 62/984,078, filed on Mar. 2, 2020.

(51) Int. Cl.
*G06N 10/00*     (2022.01)
*H01L 39/22*     (2006.01)
*H01L 39/02*     (2006.01)

(52) U.S. Cl.
CPC ........... *G06N 10/00* (2019.01); *H01L 39/025* (2013.01); *H01L 39/223* (2013.01)

(58) Field of Classification Search
CPC ........ G06N 10/00; G06N 10/40; H01L 27/18; H01L 39/025; H01L 39/223
See application file for complete search history.

(56) References Cited

U.S. PATENT DOCUMENTS

2020/0287540 A1*  9/2020  Smith ............... H01L 27/18

OTHER PUBLICATIONS

Leroux, et al.; "Technical notes for the zero ZZ CR gate"; Feb. 8, 2021; 31 Pages.
Yan, et al.; "Engineering Framework for Optimizing Superconducting Qubit Designs"; Jun. 7, 2020; 6 Pages.

* cited by examiner

*Primary Examiner* — Matthew L Reames
(74) *Attorney, Agent, or Firm* — Daly, Crowley, Mofford & Durkee LLP

(57) ABSTRACT

A quantum circuit called a "qumon" is provided to cancel unwanted ZZ interaction in a superconducting qubit architecture. The qumon qubit has a high coherence, and a positive anharmonicity that may be tuned to cancel the negative anharmonicity in a coupled qubit, such as a transmon qubit. The qumon has three parallel branches, in which are a shunt capacitor; a Josephson junction having weighted energy level and capacitance; and several Josephson junctions in series. The weight is chosen to provide the desired anharmonicity, and the transverse flux noise and transverse charge noise each decrease in proportion to the number of the Josephson junctions in series. Because unwanted ZZ interactions are canceled, qumon qubits and transmon qubits may be capacitively coupled in an alternating pattern to provide a surface code in which these interactions are canceled in an extensible way.

22 Claims, 11 Drawing Sheets

CANCELLATION OF UNWANTED INTERACTIONS IN A SUPERCONDUCTING QUANTUM ARCHITECTURE

CROSS REFERENCE TO RELATED APPLICATIONS

This application claims the benefit of U.S. Provisional Application 62/984,078, filed Mar. 2, 2020, the entire contents of which are incorporated by reference herein.

STATEMENT REGARDING FEDERALLY SPONSORED RESEARCH

This invention was made with government support under W911 NF-18-1-0411 awarded by the Army Research Office (ARO). The government has certain rights in the invention.

FIELD

This disclosure relates generally to quantum structures and, more particularly, to quantum structures which cancel unwanted ZZ interaction in a superconducting qubit architecture.

BACKGROUND

As is known in the art, there exists a trend toward providing large scale superconducting quantum processors using superconducting circuits. Conventional approaches are subject to an unwanted loss mechanisms resultant from ZZ interaction between quantum bits (qubits). This loss mechanism prevents high gate fidelities and scaling to large systems.

SUMMARY OF DISCLOSED EMBODIMENTS

In view of the above, in accordance with the concepts sought to be protected herein, described are circuits and methods to cancel unwanted ZZ interaction in a superconducting qubit architecture and thereby achieve gates having a fidelity which is higher than convention gates with fewer errors. Such circuits and methods are thus suitable for use in large-scale superconducting quantum processors using superconducting circuits.

Thus, a first embodiment is a qubit, hereinafter also called a "qumon". The qubit includes a capacitor, a first Josephson junction in parallel with the capacitor, and a plurality having a number N of second Josephson junctions in a series. The series of second Josephson junctions is in parallel with the capacitor and the first Josephson junction. The first Josephson junction has a junction energy that is a weight factor E multiplied by a junction energy of one of the second Josephson junctions, where E multiplied by N is less than 1.

In some embodiments, the number N of second Josephson junctions is at least 8, or at least 16. Certain performance characteristics of the qumon qubit described below are made better as the number N of Josephson junctions in series increases.

In some embodiments, junction energies of each of the second Josephson junctions are equal to each other, while in some embodiments, junction capacitances of each of the second Josephson junctions are equal to each other. In these embodiments the junctions may be made substantially identical to each other.

In some embodiments, the first Josephson junction has a junction capacitance that is E multiplied by the junction capacitance of each of the second Josephson junctions. That is, both the Josephson energy and the capacitance of the first junction may be in the same proportion E to the energy and capacitance of the other junctions that are in series.

In some embodiments, E multiplied by N is greater than ⅓. Thus, in such embodiments, the reciprocal of this product, a quantity denoted q in what follows, varies between 1 and 3.

Some embodiments are capacitively coupled to a second qubit having a negative anharmonicity.

In some embodiments, the qubit has a positive anharmonicity that cancels a portion of the negative anharmonicity of the second qubit.

Some embodiments further include a first terminal capacitively coupled to the qubit and a second terminal capacitively coupled to the second qubit. Such terminals provide setting and reading out the values of the qubits.

In some embodiments, the second qubit comprises a transmon qubit.

In some embodiments, the transmon qubit is tunable.

Some embodiments are capacitively coupled to a plurality of other qubits, to thereby provide a surface code free of unwanted ZZ interactions. In embodiments, the plurality of other qubits may comprise at least one qumon qubit, or at least one transmon qubit.

It is appreciated that the concepts, techniques, and structures described herein may be embodied in other ways, and thus that the summary of embodiments above is merely illustrative, not comprehensive.

BRIEF DESCRIPTION OF THE DRAWINGS

The concepts, structures, and techniques described herein may be more fully understood from the following detailed description of the drawings, in which.

The drawings are not necessarily to scale, or inclusive of all elements of a system, emphasis instead generally being placed upon illustrating the concepts, structures, and techniques described herein.

DETAILED DESCRIPTION

Figure 1:
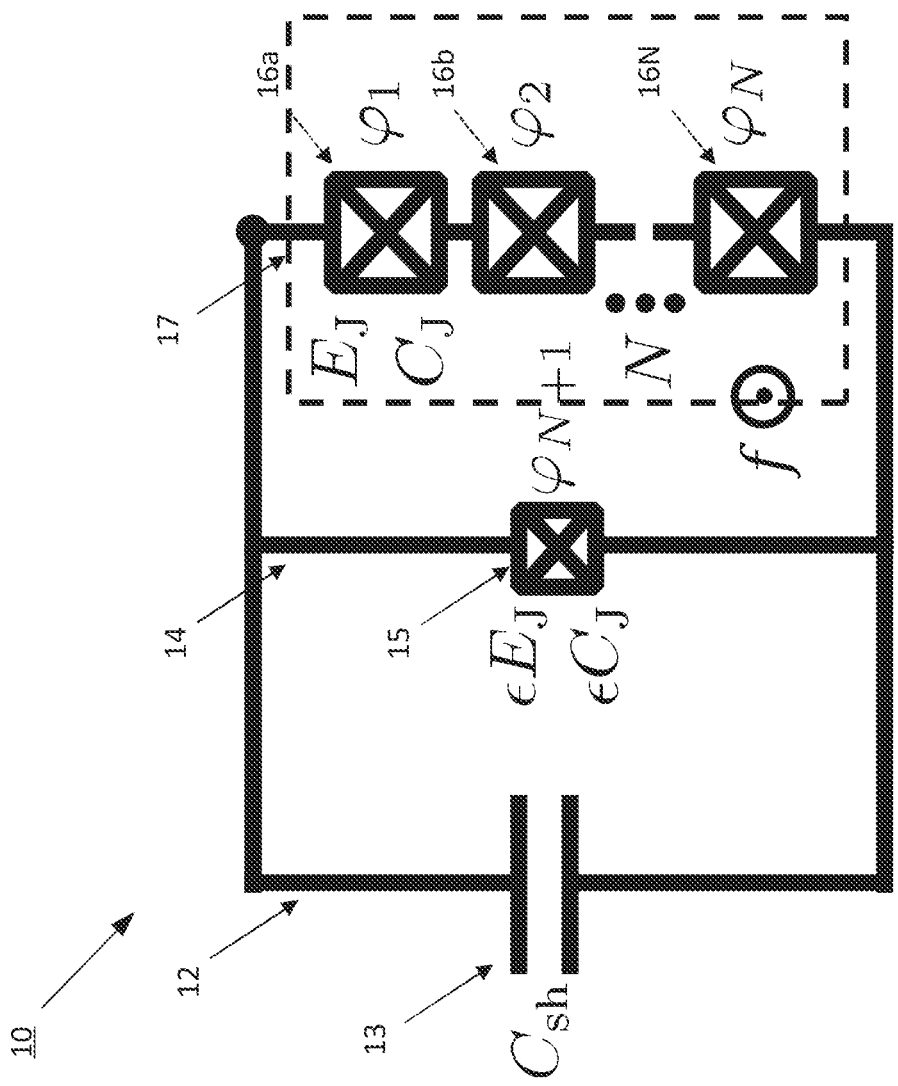
FIG. 1 is a circuit model of a superconducting qumon qubit according to an embodiment of the concepts, techniques, and structures disclosed herein.

Referring now to FIG. 1, a superconducting qumon qubit 10 a comprises three parallel branches 12, 14, 17. The first branch 12 includes at least one capacitive element 13, here a shunt capacitance with value $C_{sh}$. The second branch 14 of the superconducting qumon qubit 10 includes one or more Josephson junctions (with a single Josephson junction 15 being shown in the example of FIG. 1). The third branch 17 of qumon qubit 10 comprises a plurality of Josephson junctions 16a-16N (collectively, "junctions 16"), where N>1 is a whole number corresponding to the number of junctions 16. The Josephson junctions 16 are serially coupled within the third branch 17 and that third branch 17 is coupled in parallel with first branch 12 and second branch 14.

In accordance with embodiments of the concepts, techniques, and structures disclosed herein, the characteristics of the capacitive element 13 and the Josephson junctions 15, 16 are determined so that the qumon qubit 10 is weakly anharmonic. In some embodiments, each Josephson junction 16 in the third branch 17 has equal energy $E_J$ and capacitance $C_J$, while the Josephson junction 15 in the second branch 14 has a characteristic energy $\varepsilon E_J$ and capacitance $\varepsilon C_J$, where E is a weight parameter selected so that the qumon 10 is weakly anharmonic and highly coherent. In some embodiments, however, some or all of the Josephson junctions 16a-16N may have different characteristics, and E may be chosen with respect to an overall energy or capacitance of the third branch 17, or with respect to a particular Josephson junction in the third branch 17.

The number N of junctions 16 in the third branch 17 should be large as possible, because the qumon is less susceptible to flux and charge noise as the number of junctions N increases. In particular, the transverse flux noise sensitivity of the qumon may be expressed as:

$$\left(\frac{1}{T_{1f}}\right)^{1/2} \propto K_{\perp,f} \propto \frac{E_J}{N}.$$

The transverse charge noise sensitivity of the qumon may be expressed as:

$$\left(\frac{1}{T_{1q}}\right)^{1/2} \propto K_{\perp,q} \propto \frac{1}{NC_{sh}}$$

in which:

$T_{1f}$ denotes the relaxation lifetime of the qumon due to flux noise;

$K_f$ is the flux noise sensitivity of the qumon;

$T_{1q}$ denotes the relaxation lifetime due to charge noise; and $K_q$ denotes the charge noise sensitivity of the qumon.

To cancel out the unwanted ZZ interaction, a ratio parameter q is defined as $q=1/(\varepsilon N)$. For a given N, the anharmonicity and frequency of the qumon qubit 10 are then determined by the parameters N, $\varepsilon$, and q. In particular, by numerically calculating the parameter q, the circuit may be fine-tuned such that the spectral properties of the qumon correspond to a weakly anharmonic qubit that can be used to cancel out the unwanted ZZ interaction. For a qumon, such as qumon 10, the parameter q illustratively ranges between approximately 1 and 3. The effects of changing q can be seen in FIG. 8, which shows the unwanted ZZ interaction as a function of the transmon frequency for various selected parameters including q.

An external magnetic flux f having a specific value may be applied to the qubit. The external flux is set to be at half of the flux quantum, which is the operating working point of the qumon qubit that protects the qubit from decoherence. By proper selection of the external flux f and characteristics of the elements in branches 12, 14, and 17 (e.g. capacitor and Josephson Junction characteristics including selection of E), the qumon 10 may be provided having a relatively large anharmonicity characteristic (i.e. anharmonicity characteristic greater than zero and comparable to that of a transmon qubit), but with an opposite sign to that of the transmon qubit. In general the qumon is responsive over a large frequency range, and is less sensitive to charge noise than conventional qubits. As will be discussed below, such characteristics are favorable when a qumon is coupled to a transmon.

Figure 2:
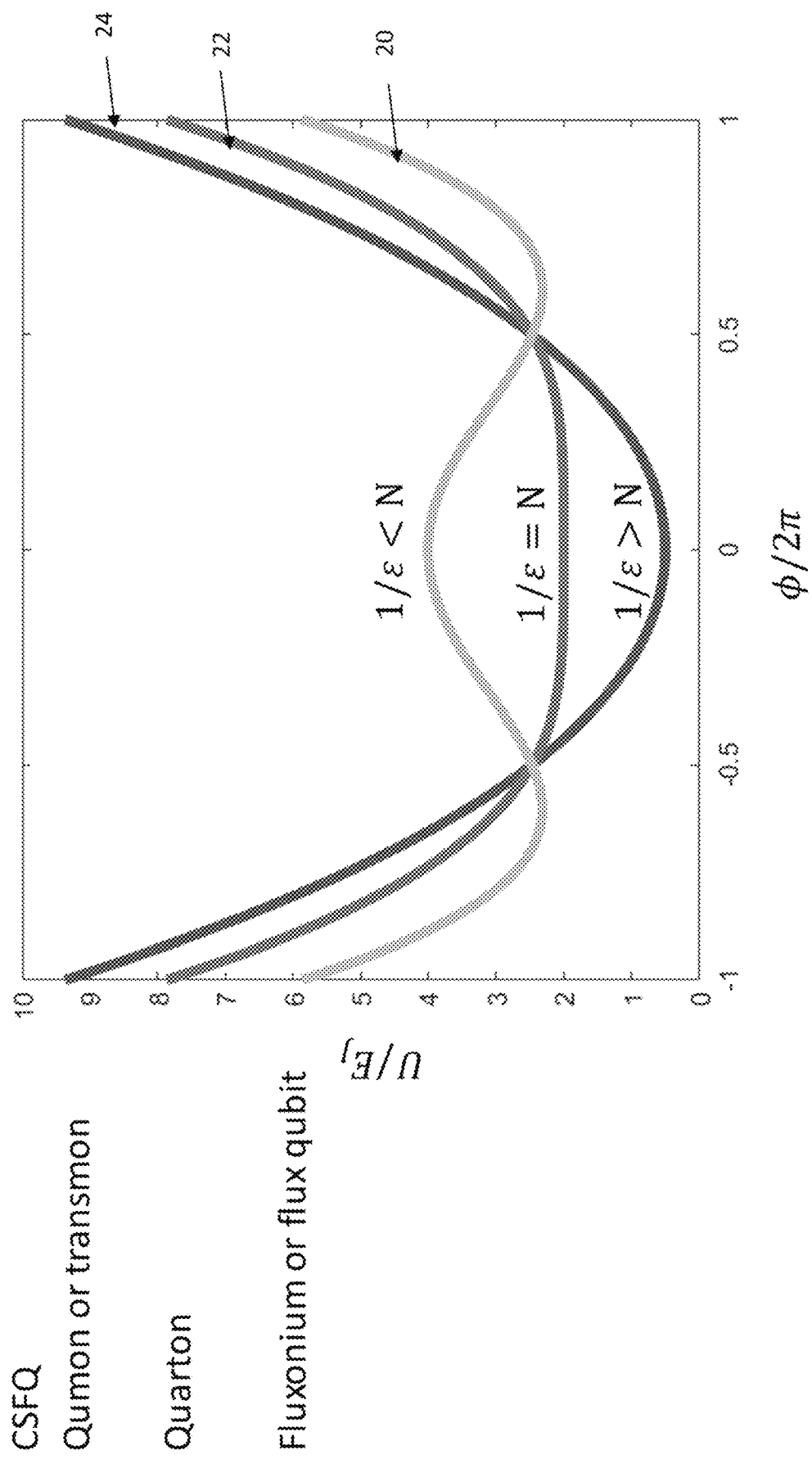
FIG. 2 is a graph of the ratio of the qumon potential energy U to the energy $E_J$ of its Josephson junctions, as a function of the relative magnetic phase $\phi/2\pi$.

Referring now to FIG. 2, shown is a plot of the ratio of the qumon potential energy U to the energy $E_J$ of its Josephson junctions as a function of the relative magnetic phase $\phi/2\pi$. As can be seen from curves 20-24, for different type of qubits (i.e. fluxonium, quarton, capacitively-shunted flux qubit) the ratio of $1/\varepsilon$ changes from less than N ($1/\varepsilon$<N) to equal to N ($1/\varepsilon$=N) to greater than N ($1/\varepsilon$>N). The ratio of qubit potential energy U to the energy $E_J$ of its Josephson junctions is generally lower at a given magnetic phase. Thus, the qumon has characteristics different from known structures such as a fluxonium and a quarton. For the fluxonium, the energy potential 20 has the characteristics of a double well, which determines the coherence properties and the frequency of the fluxonium. The quarton potential 22 has a quartic potential. The qumon potential 24 sets it apart from other circuits, as it has a weakly anharmonic potential that enables it to have high coherence.

Figure 3:
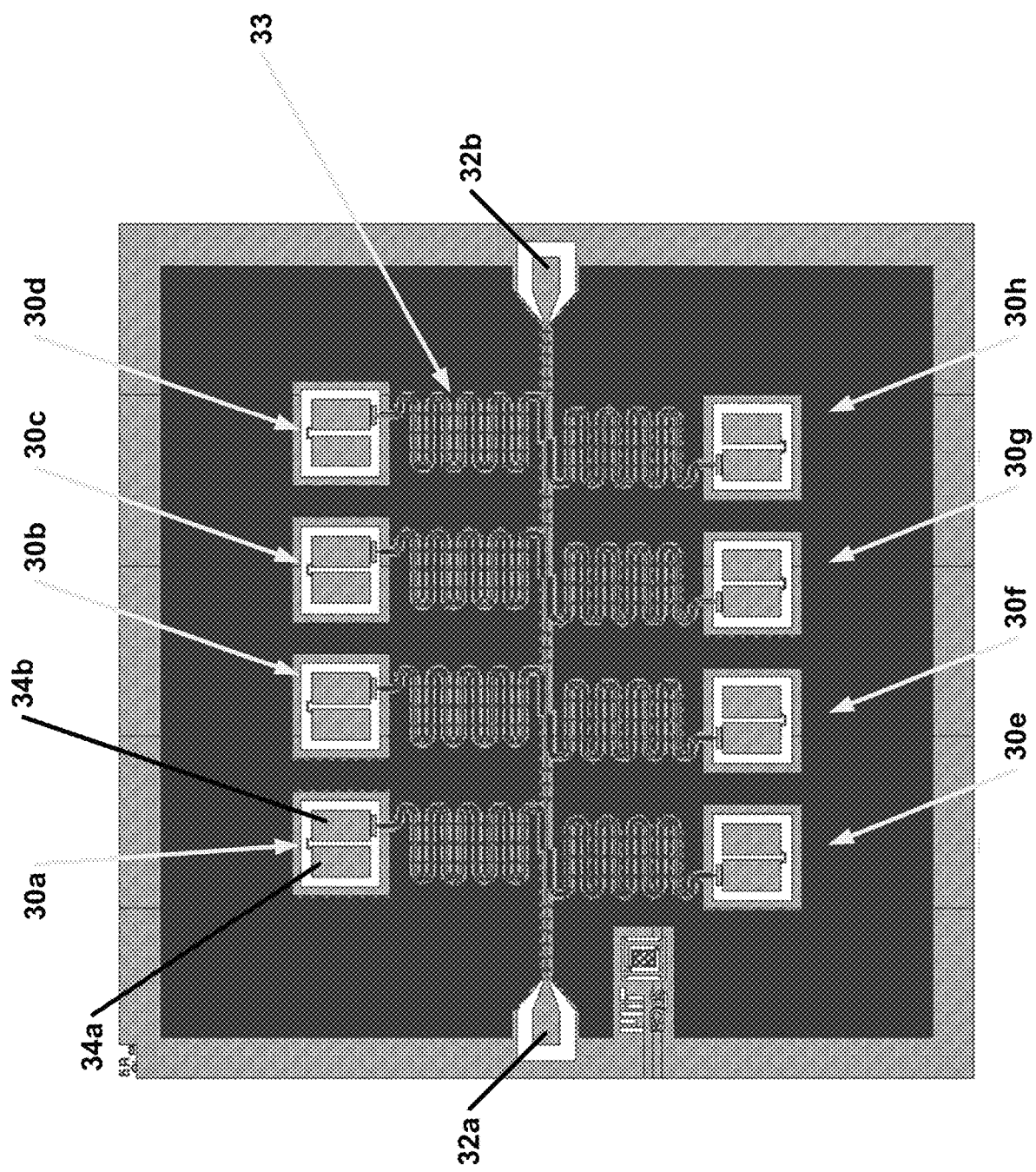
FIG. 3 is an illustrative photomask for a circuit having eight qumon qubits.

Referring now to FIG. 3, shown is an illustrative photomask for a circuit having eight qumon qubits 30a-30h coupled through signal paths 33 of a readout circuit to readout ports 32a, 32b. It should be noted that only one signal path is identified with a reference numeral 33 in FIG. 3, and that the photomask has several such signal paths. Each qumon qubit includes the structures illustrated in FIG. 1 with only conductive pads (e.g. 34a, 34b for qumon qubit 30a) readily visible in FIG. 3.

Figure 4:
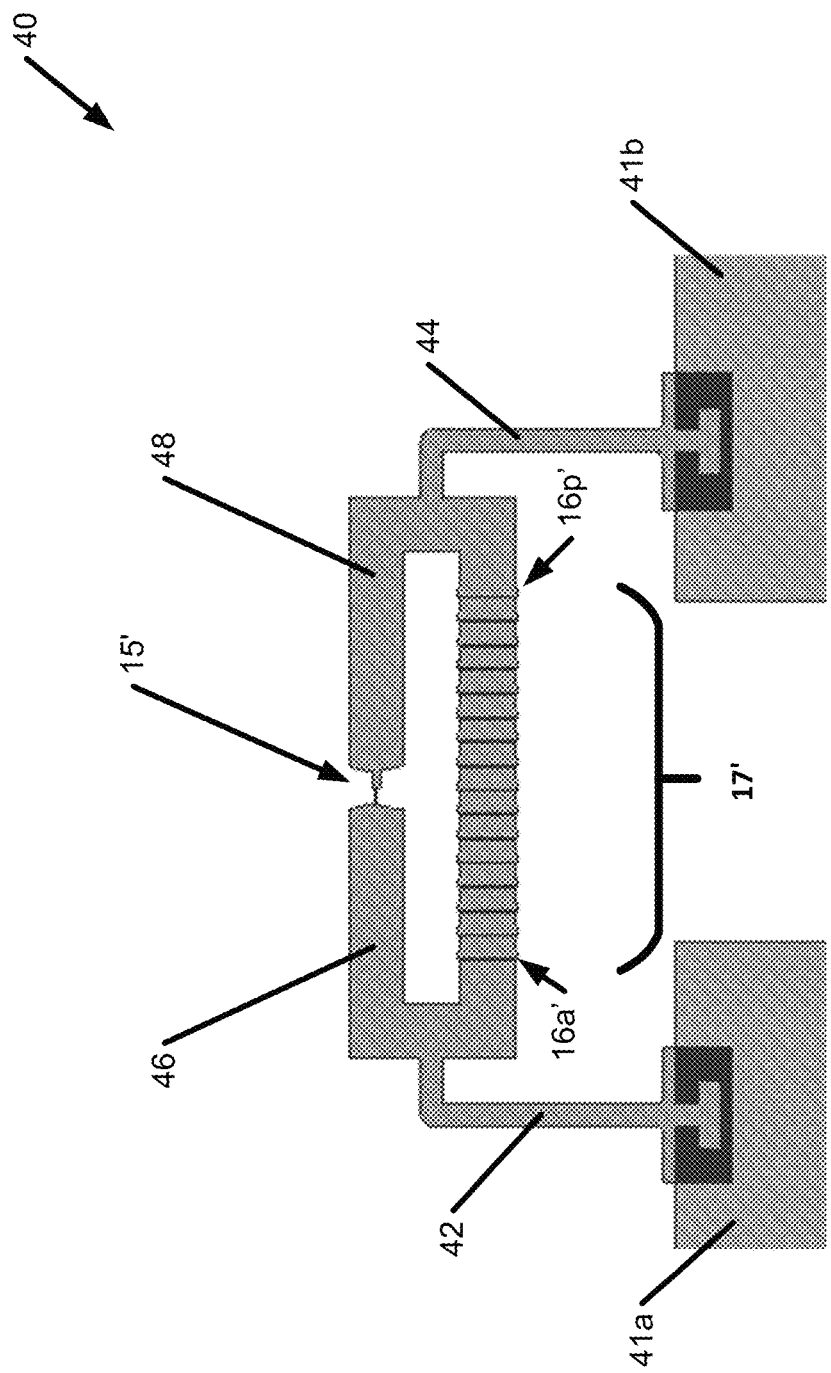
FIG. 4 is an enlarged view of the photomask of FIG. 3, showing details of two conductive plates having between them a single qumon qubit with N=16 serial Josephson junctions in parallel with another Josephson junction.

Referring now to FIG. 4, shown is a qumon qubit 40 which may be the same as or similar to qumons 10 and 30a-30h described above in conjunction with FIGS. 1 and 3. Two conductive pads 41a, 41b serve as capacitive elements having coupled there between a single qumon qubit 40. The qumon 40 has a first branch 17' having a plurality (here N=16) of serial Josephson junctions 16a'-16p' coupled in parallel with a second branch comprising a single Josephson junction 15'. Josephson junction 15' and Josephson junctions 16a'-16p' may be the same as or similar to the respective Josephson junction 15 and Josephson junctions 16 described above in conjunction with FIG. 1.

A first signal path 42 couples pad 40a to a first end of the sixteen serial Josephson junctions and a second signal path 44 couples a second end of the sixteen serial Josephson junctions to pad 40b. Signal paths 46, 48 and Josephson junction 15' form a second branch in parallel with the first branch. Thus, the sixteen serial Josephson junctions are in a first branch and Josephson junction 15' is in a second branch parallel coupled to the first branch.

Figure 5:
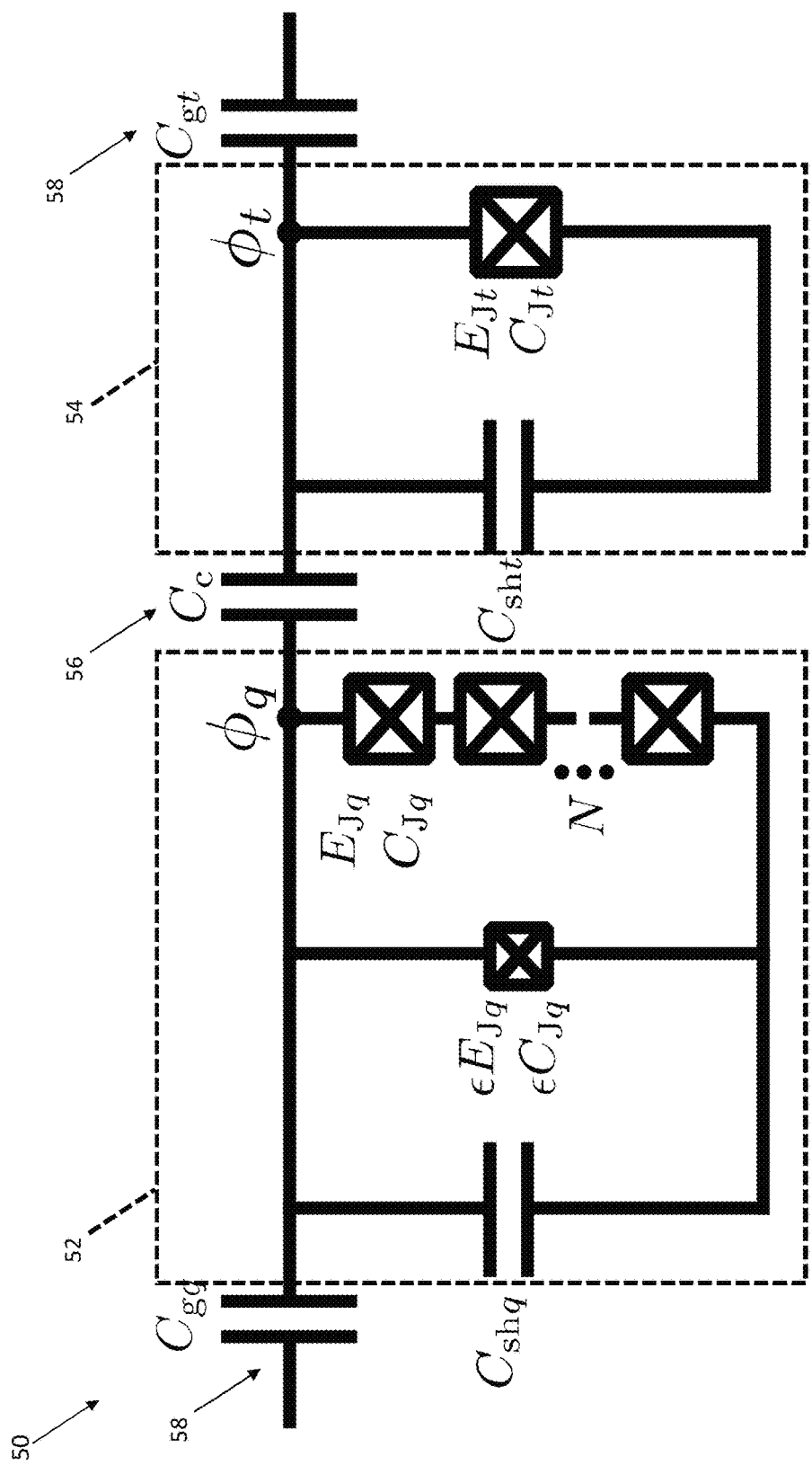
FIG. 5 is a circuit model of a qumon qubit coupled to a transmon qubit to cancel the unwanted ZZ interactions in the latter, according to an embodiment.

Referring now to FIG. 5, a two-qubit architecture 50 (also sometimes referred to a "two-qubit device" 50) comprises a qumon qubit 52 coupled to a transmon qubit 54. Qumon qubit 52 may be the same as or similar to any of the qumon qubits described above in conjunction with FIGS. 1, 3 and 4. In this example embodiment, the qumon qubit 52 is capacitively coupled to the transmon qubit 54 via a coupling capacitor 56 (having a capacitance Cc in FIG. 5). It should, of course, be appreciated that in other embodiments, qumon qubit 52 may be coupled to transmon qubit 54 via a resonator. More generally, it should be understood that qumon qubit 52 may be coupled to transmon qubit 54 using any direct or indirect coupling technique.

With this particular arrangement, the two-qubit architecture 50 lacks substantial ZZ interaction. The qumon qubit 52 operates as a weakly anharmonic oscillator having anharmonicity characteristic comparable to that of the transmon qubit 54, but with an opposite sign (e.g. a positive sign). Thus, coupling the qumon qubit 52 to the transmon qubit 54 advantageously completely (or at least partially) cancels ZZ interaction in the transmon qubit 54. This ability to cancel ZZ interaction is determined, at least in part, by the coupling strength between the qumon qubit 52 and the transmon qubit 54. In this example embodiment, the capacitive coupling characteristics of coupling capacitor 56 determines, at least in part, the coupling strength between qumon qubit 52 and transmon qubit 54.

The two-qubit architecture 50 may be included in a superconducting qubit architecture to provide gates with a fidelity characteristic that is higher than conventional gates, and with less errors than conventional approaches which do not cancel ZZ interaction. Thus, such circuits are suitable for use in large scale superconducting quantum processors.

It has been found that preferred characteristics of a qumon qubit for use in the two-qubit architecture 50 occurs when $\varepsilon \approx 1/(2N)$, where N is the number of serially coupled Josephson junctions in one branch of the qumon (e.g. branch 17 in the example of FIG. 1). That is, the parameter $q=1/(\varepsilon N) \approx 2$, although illustratively this parameter q may range between about 1 and 3. By tuning the parameter q, the unwanted ZZ interaction may be completely eliminated.

While a coupling capacitor 56 provides the coupling characteristic in this example, as noted above other coupling elements may also be used, including but not limited to resonators. It should also be appreciated that while it is generally desirable to couple the qumon qubit 52 to the transmon qubit 54 as strongly as possible, care must be taken to not lose anharmonicity. Thus, in the illustrative embodiment of FIG. 5 in which a coupling capacitor 56 is used, the device 50 may lose anharmonicity if the capacitance of coupling capacitor 56 exceeds a threshold level.

Figure 6A:
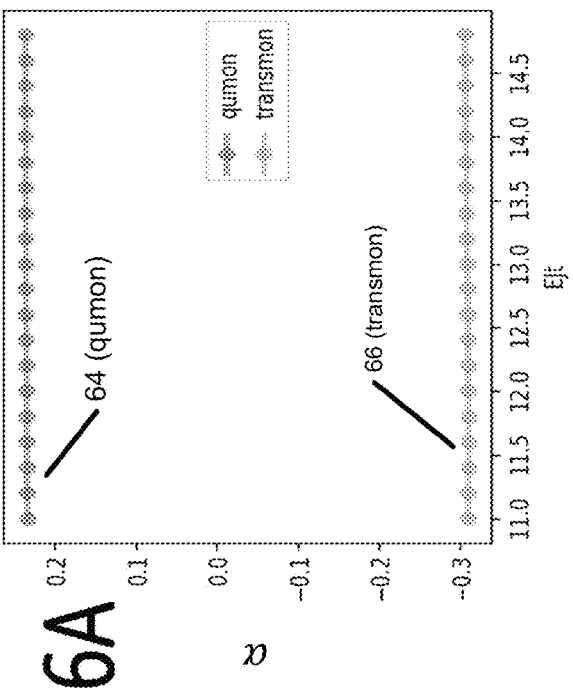
FIG. 6A is a plot of the anharmonicity of the qumon and transmon as a function of the transmon Josephson junction energy.
Figure 6:
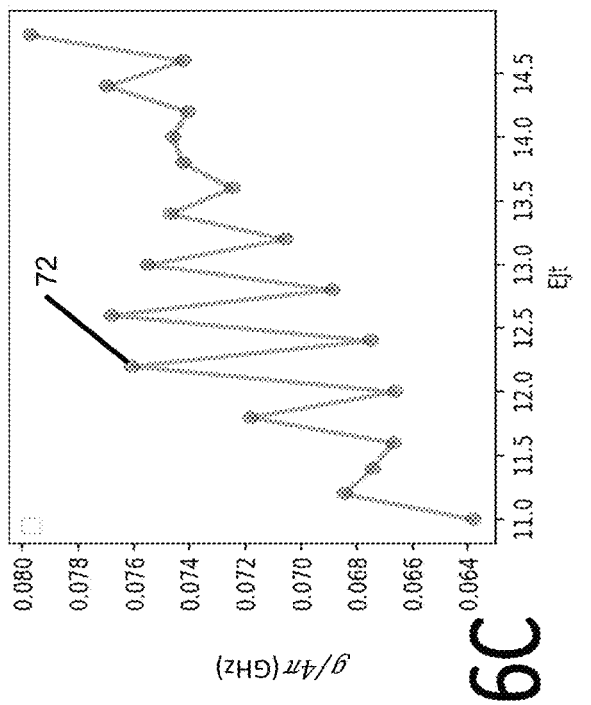
FIG. 6 is a plot of frequency as a function of the transmon Josephson junction energy $E_{Jt}$ for the qumon and the transmon in the circuit of FIG. 5.

Referring now to FIG. 6, shown is a plot of the frequency in GHz of a two-qubit device (which may be the same as or similar to two-qubit device 50 described in conjunction with FIG. 5) as a function of the transmon Josephson junction energy $E_{J_T}$. Curve 60 illustrates a frequency response characteristic of the transmon, while curve 62 illustrates the frequency response characteristic of the qumon.

Referring now to FIG. 6A, curve 64 illustrates a positive anharmonicity a of the qumon vs. transmon Josephson junction energy, while curve 66 illustrates the negative anharmonicity of the transmon vs. its own Josephson junction energy. These characteristics allow the qumon and transmon to be combined (e.g. as described in FIG. 5) in a way which results in cancellation of ZZ interaction.

Figure 6C:
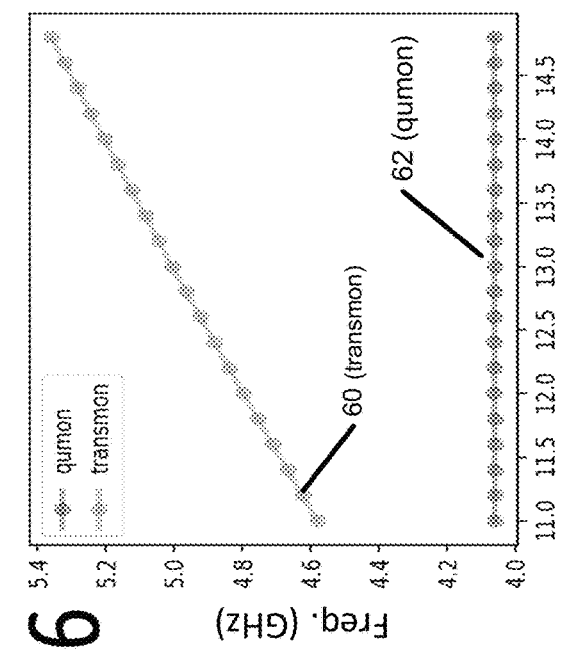
FIG. 6C is a plot of coupling strength $g/4\pi$ as a function of the transmon Josephson junction energy.
Figure 6B:
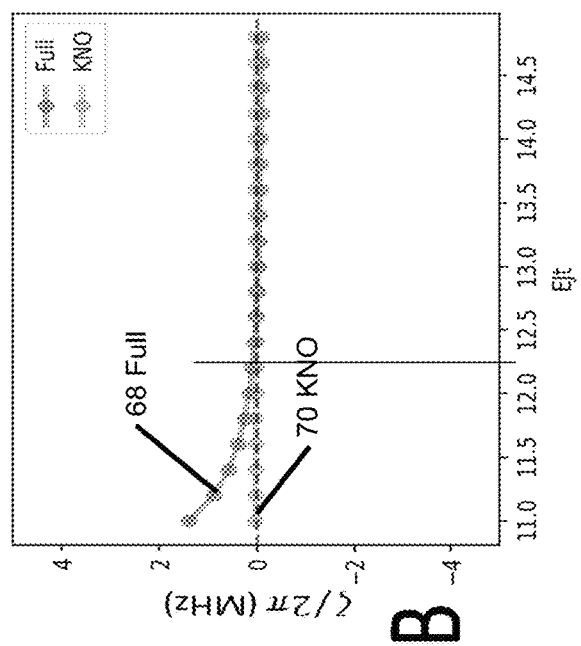
FIG. 6B is a plot of unwanted ZZ interaction $\zeta/2\pi$ as a function of the transmon Josephson junction energy.

Referring now to FIG. 6B, curve 68 illustrates the residual unwanted ZZ interaction of a two-qubit device (such as the two-qubit device 50 of FIG. 5) vs. transmon Josephson junction energy while curve 70 marks a baseline of zero ZZ interaction. Thus, curve 68 indicates substantially complete cancellation of ZZ interaction (that is, $\zeta<50$ KHz) above transmon Josephson junction energy values of about 12.25, as indicated by the vertical line on the plot. By comparison, the ZZ interaction for two coupled transmons is $\zeta \sim 0.95$ MHz.

Referring now to FIG. 6C, curve 72 illustrates coupling strength $g/4\pi$ vs. Josephson junction energy. The ability to cancel out the unwanted ZZ interaction in the qumon-transmon circuit of FIG. 5 allows for a coupling strength which is relatively high compared with the coupling strength of existing circuits with two coupled transmons. For the same coupling strength a similar device with two coupled transmons will results in unwanted ZZ interaction 64 (and in some cases, results in very high unwanted ZZ interaction).

Figure 7A:
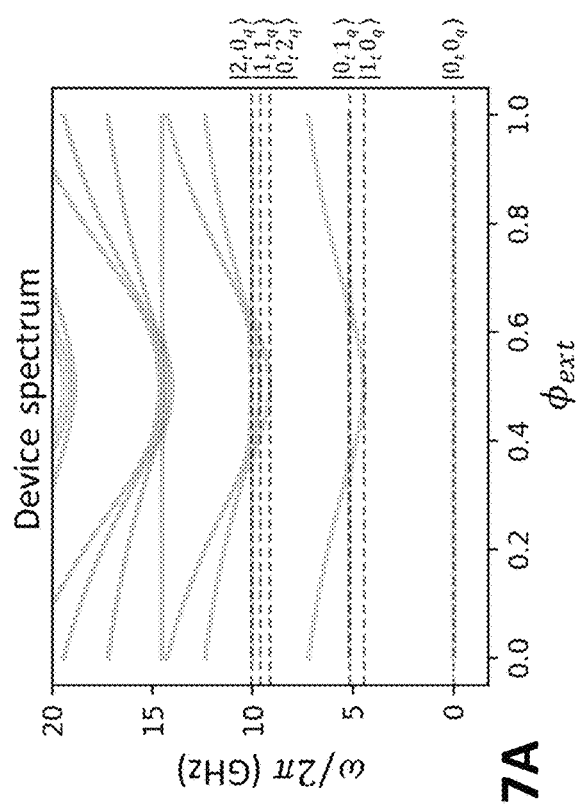
FIG. 7A is a plot of frequency spectrum as a function of the phase of the external field for a device which may be the same as or similar to the two qubit device of FIG. 5.
Figure 7B:
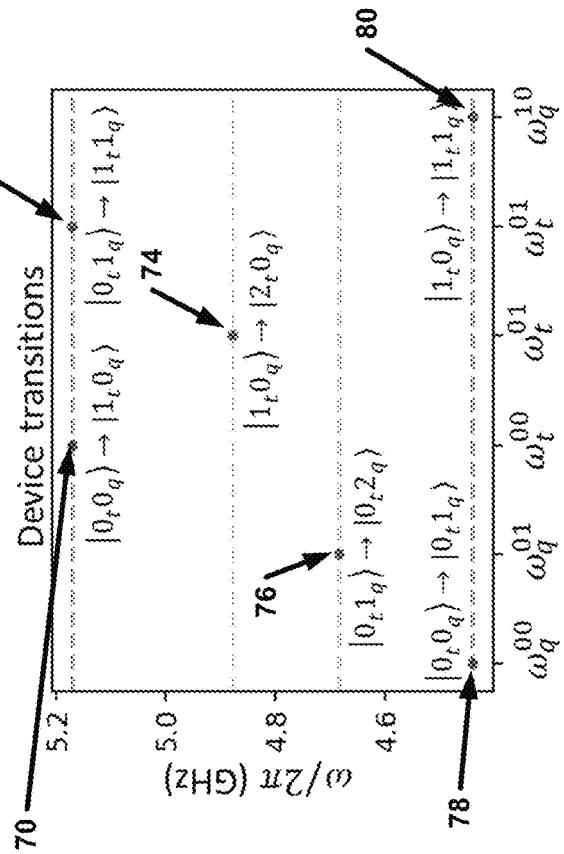
FIG. 7B is a plot of the state transitions for a device which may be the same as or similar to the two qubit device of FIG. 5.
Figure 7:
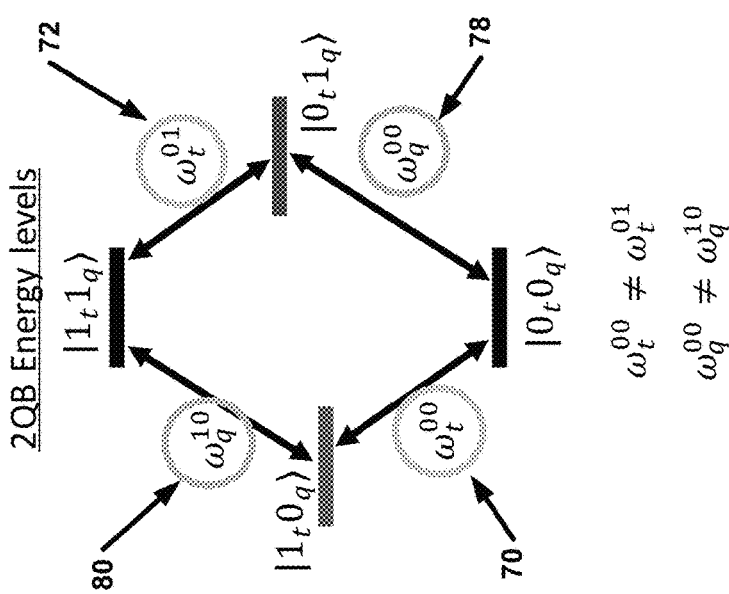
FIG. 7 is a diagram showing energy levels of mixed quantum states in a two qubit device may be the same as or similar to the two qubit device of FIG. 5, indicating transition frequencies.

Referring now to FIGS. 7-7B, in which like elements are provided having like reference designations throughout the several views, shown is a diagram of energy levels for the direct capacitive coupled qumon-transmon arrangement described above in conjunction with FIG. 5, focusing on the CR effective Hamiltonian:

$$\frac{2\hat{H}}{\hbar} \approx \Omega_{CR}^{target} ZX + \zeta ZZ$$

where the cross-Kerr static ZZ interaction maybe expressed as:

$$\zeta = \omega_{01} + \omega_{10} - \omega_{11}.$$

Capacitively coupling a qumon and a transmon as shown in FIG. 5, for example, results in two-qubit energy levels as shown in FIG. 7. Device spectrum and device transitions are shown in FIGS. 7A, 7B, respectively. ZZ interactions are cancelled by optimizing circuit characteristics to obtain the device transition responses shown in FIG. 7B. As shown in FIG. 7B, energy levels 70-80 correspond to the energy levels in FIG. 7 and are also shown in FIG. 7A occurring below a frequency of about 10 GHz. FIG. 7A provides the full analysis of the energy spectrum of the two-qubit device. FIG. 7B only focuses on the first and second excited states of the two-qubit device of FIG. 5 and is illustrated in terms of transition energies in FIG. 7.

Figure 8:
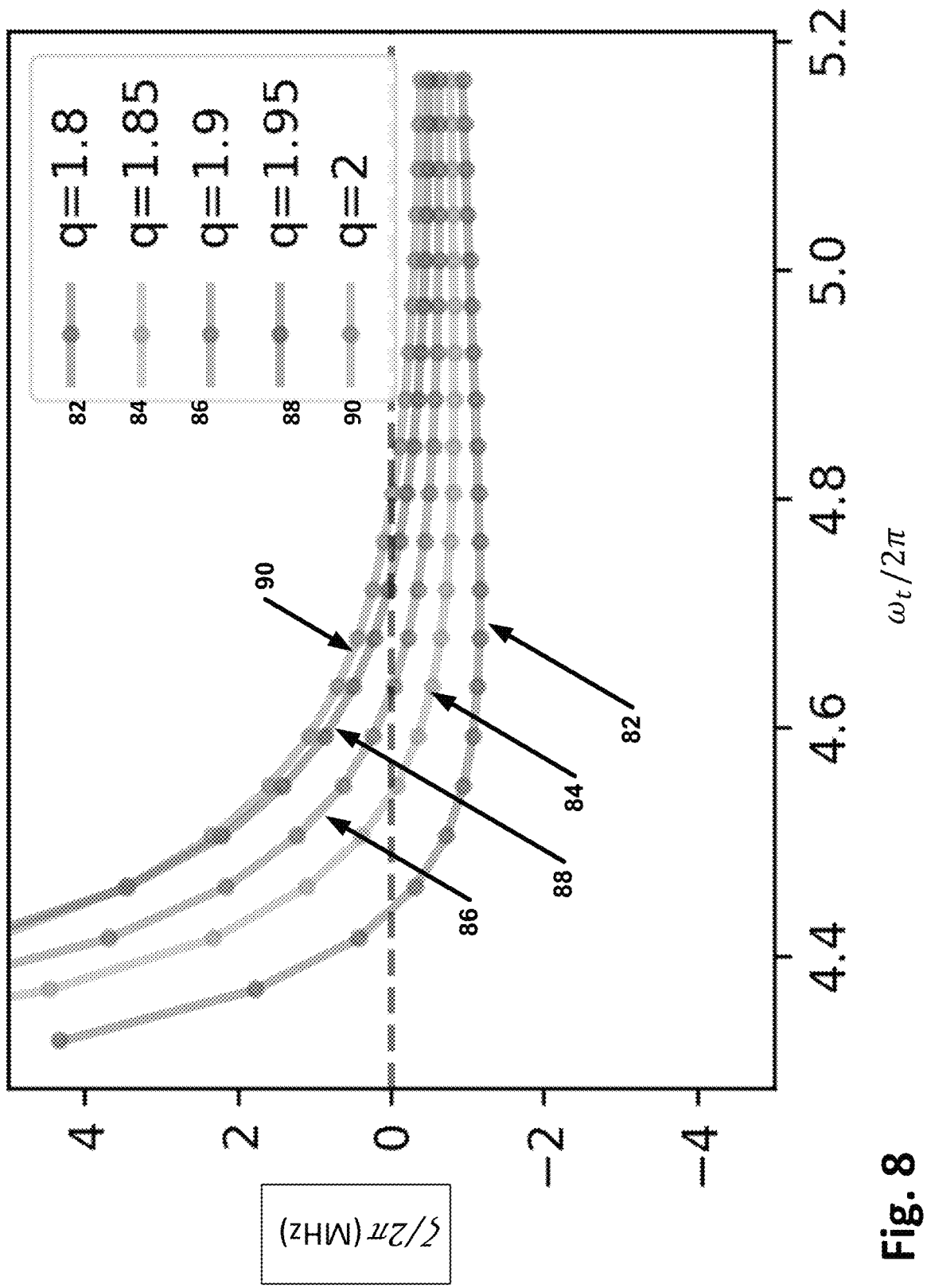
FIG. 8 is a plot of the unwanted ZZ interaction $\zeta/2\pi$ as a function of transmon frequency $\omega_t/2\pi$ and as a function of the parameter q, where q is given by $q=1/(\varepsilon*N)$, for a device which may be the same as or similar to the two qubit device of FIG. 5.

Referring now to FIG. 8, shown is a plot of the unwanted ZZ interaction $\zeta/2\pi$ of a two-qubit device which may be the same as or similar to two-qubit device 50 described in FIG. 5, as a function of the transmon frequency $\omega_t/2\pi$. Curves 82-90 illustrate device variations for a direct capacitive coupling qumon-transmon arrangement (e.g. as described above in conjunction with FIG. 5), which result in ZZ cancellation properties. The parameter q is given by $q=1/(\varepsilon N)$, where N is the number of junctions and E is the ratio of the Josephson energy of the small junction 15 in branch 14 to that of the large junctions 16 in branch 17 of FIG. 1.

For a given number of junctions N, cancellation of the unwanted ZZ interaction $\zeta/2\pi$ should occur in a broad frequency range. The unwanted ZZ interaction $\zeta/2\pi$ is negligible for values resulting in less than 50 kHz. The dashed line crossing zero is marking the complete cancelation of the unwanted ZZ interaction $\zeta 2\pi$. Curves 82-90 are numerical calculation of the unwanted ZZ interaction of the circuit presented in FIG. 5 as a function of the transmon frequency for various parameters defined by q. For a given q, N and E the frequency of the transmon $\omega_t/2\pi$ can be set resulting in complete cancelation of the unwanted ZZ interaction $\zeta 2\zeta$.

Figure 9A:
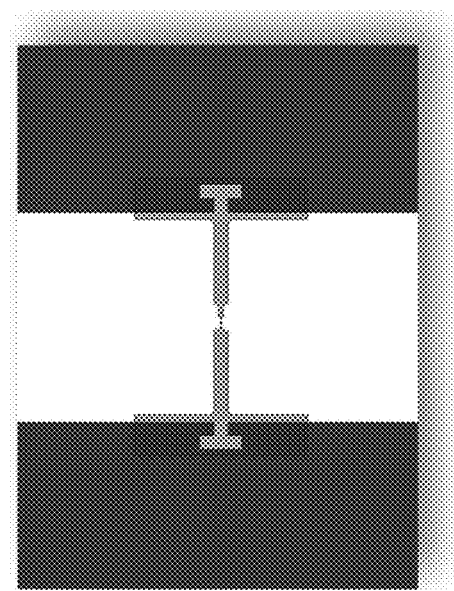
FIG. 9A is an enlarged view of the photomask of FIG. 9, showing details of two conductive plates having between them a transmon qubit.
Figure 9B:
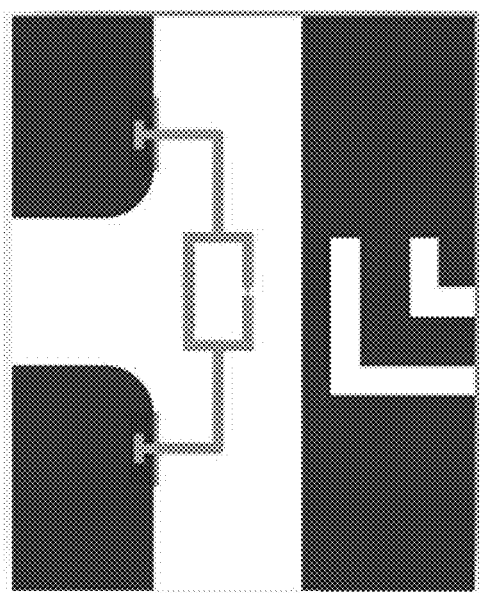
FIG. 9B is an enlarged view of the photomask of FIG. 9, showing details of two conductive plates having between them a qumon qubit with N=8 serial Josephson junctions in parallel with another Josephson junction.
Figure 9:
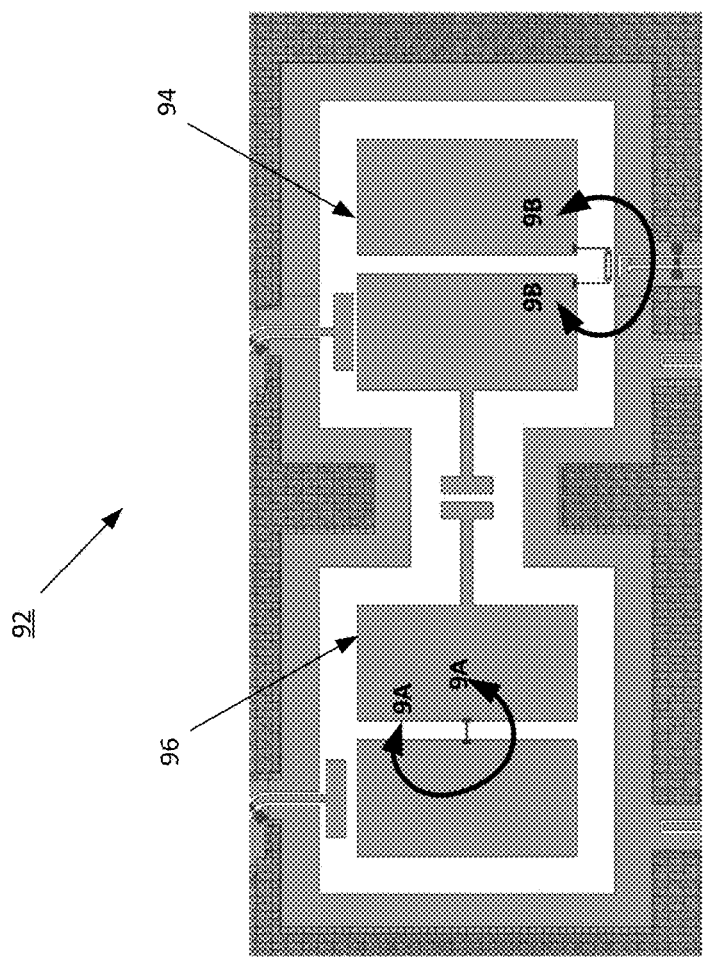
FIG. 9 is an illustrative photomask for the two qubit circuit of FIG. 5 having a qumon qubit capacitively coupled to a transmon qubit.

Referring now to FIG. 9, an illustrative photomask for a two qubit circuit 92 which may be the same as or similar to that described in conjunction with FIG. 5 includes a qumon qubit 94 capacitively coupled to a transmon qubit 96. FIG. 9A is an enlarged view of a portion of the photomask of FIG. 9, showing details of two conductive plates (or pads) having between them a transmon qubit. FIG. 9B is an enlarged view of a portion of the photomask of FIG. 9, showing details of two conductive plates having between them a qumon qubit with N=8 serial Josephson junctions in parallel with another Josephson junction.

Figure 10A:
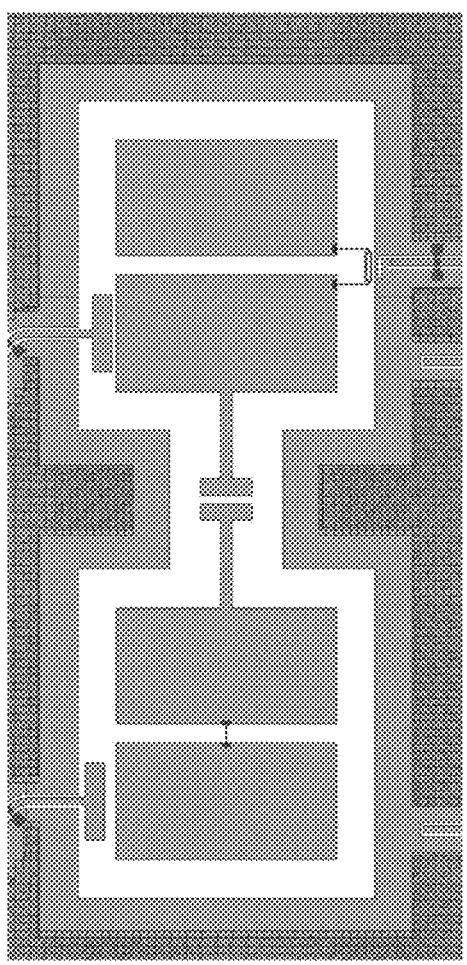
FIG. 10A is an enlarged view of a portion of the photomask of FIG. 10, showing a qumon qubit capacitively coupled to a fixed transmon qubit.
Figure 10B:
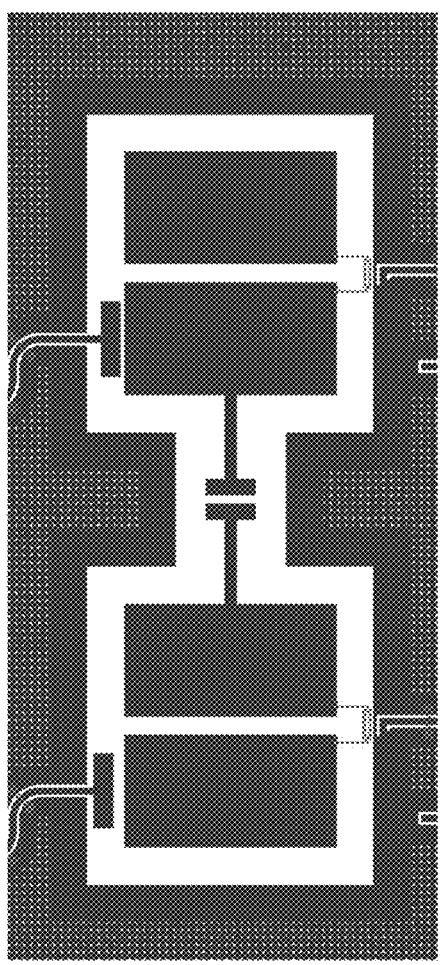
FIG. 10B is an enlarged view of a portion of the photomask of FIG. 10, showing a qumon qubit capacitively coupled to a tunable transmon qubit.
Figure 10:
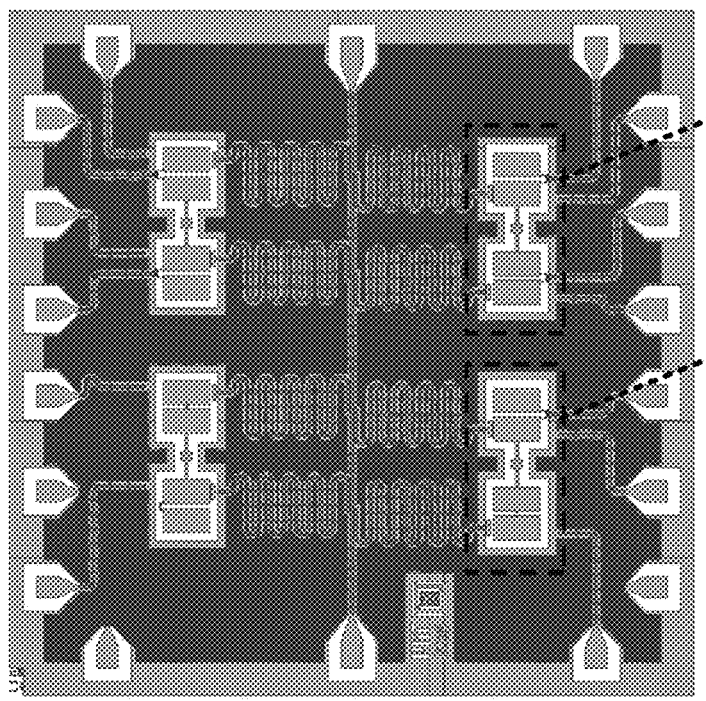
FIG. 10 is an illustrative photomask for a circuit embodiment having four pairs of qumon qubits capacitively coupled to transmon qubits, where two of the transmon qubits are fixed and two of the transmon qubits are tunable.

Referring now to FIG. 10, an illustrative photomask for a test circuit having a total of four two-qubit devices each of which may be the same as or similar to that described in conjunction with FIG. 5. FIG. 10A is an enlarged view of a portion of the photomask of FIG. 10, showing details of a qumon qubit coupled to a fixed transmon, while FIG. 10 B is an enlarged view of a portion of the photomask of FIG. 10, showing details of a qumon qubit coupled to a tunable transmon.

Figure 11:
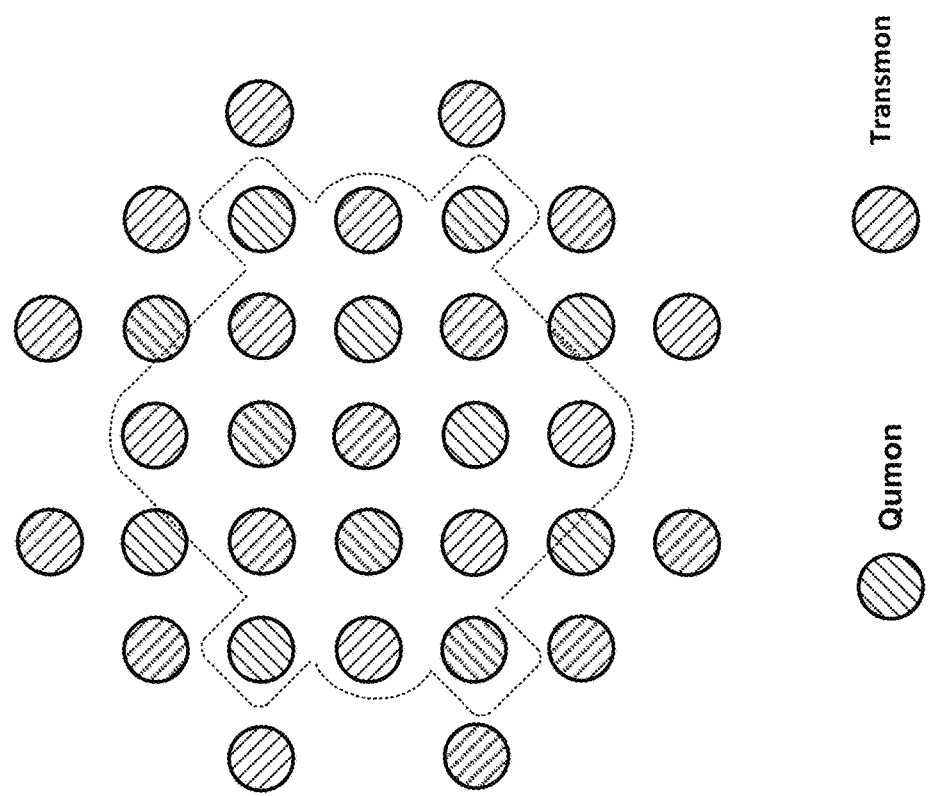
FIG. 11 is a cartoon of an architecture for a surface code cancelling ZZ crosstalk using static capacitive coupling according to an embodiment.

FIG. 11 illustrates an extensible architecture for a surface code free of unwanted ZZ interaction using a circuit which may be the same as or similar to the circuit described in conjunction with FIG. 5. It should be noted that FIG. 11 illustrates an extensible architecture for direct or indirect coupling schemes. It should also be noted the complete cancellation of the unwanted ZZ interaction could allow for: (a) large qubit-qubit interaction, which will result in faster gates and higher fidelities that are higher than existing architectures; (b) complete cancellation of the always-on ZZ interaction; and (c) allows for direct capacitive coupling between qubits. FIG. 11 show that by interchanging transmons and qumons in a grid, the residual unwanted ZZ interaction can be canceled out in an extensible way. This reduces circuit complexity when comparing to existing methods, in addition, there is no requirement for active tuning of the circuit parameters. Finally, the ability to perform fast gates may result in higher fidelity gates with less errors.

Various embodiments of the concepts systems and techniques are described herein with reference to the related drawings. Alternative embodiments can be devised without departing from the scope of the described concepts. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification.

As used herein, the terms "comprises," "comprising," "includes," "including," "has," "having," "contains" or "containing," or any other variation thereof, are intended to cover a non-exclusive inclusion. For example, a method, article, or apparatus that comprises a list of elements is not necessarily limited to only those elements but can include other elements not expressly listed or inherent to such method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," or variants of such phrases indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection knowledge of one skilled in the art to affect such feature, structure, or characteristic in connection with other embodiments whether or not explicitly described.

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub-combination. Other embodiments not specifically described herein are also within the scope of the following claims.

What is claimed is:

1. A qubit comprising:
a capacitor;
a first Josephson junction in parallel with the capacitor; and
a plurality having a number N of second Josephson junctions in a series, the series of second Josephson junctions being in parallel with the capacitor and the first Josephson junction;
wherein the first Josephson junction has a junction energy that is a weight factor ε multiplied by a junction energy of one of the second Josephson junctions, and wherein F multiplied by N is less than 1, and
wherein the first Josephson junction has a junction capacitance that is F multiplied by the junction capacitance of one of the second Josephson junctions.

2. The qubit of claim 1, wherein the number N of second Josephson junctions is at least 8.

3. The qubit of claim 2, wherein the number N of second Josephson junctions is at least 16.

4. The qubit of claim 1, wherein junction energies of each of the second Josephson junctions are equal to each other.

5. The qubit of claim 1, wherein junction capacitances of each of the second Josephson junctions are equal to each other.

6. The qubit of claim 1, wherein ε multiplied by N is greater than $1/3$.

7. The qubit of claim 1, further comprising a capacitively-coupled second qubit having a negative anharmonicity.

8. The qubit of claim 7, wherein the qubit has a positive anharmonicity.

9. The qubit of claim 7, further comprising a first terminal capacitively coupled to the qubit and a second terminal capacitively coupled to the second qubit.

10. The qubit of claim 7, wherein the second qubit comprises a transmon qubit.

11. The qubit of claim 10, wherein the transmon qubit is tunable.

12. The qubit of claim 1, further comprising a plurality of other, capacitively-coupled qubits to thereby provide a surface code free of unwanted ZZ interactions.

13. The qubit of claim 12, wherein the plurality of other qubits comprise at least one qubit according to claim 1.

14. The qubit of claim 12, wherein the plurality of other qubits comprise at least one transmon qubit.

15. A qubit comprising:
a capacitor;
a first Josephson junction in parallel with the capacitor; and
a plurality having a number N of second Josephson junctions in a series, the series of second Josephson junctions being in parallel with the capacitor and the first Josephson junction;
wherein the first Josephson junction has a junction energy that is a weight factor ε multiplied by a junction energy of one of the second Josephson junctions, and wherein ε multiplied by N is less than 1,
further comprising a capacitively-coupled second qubit having a negative anharmonicity.

16. The qubit of claim 15, wherein the qubit has a positive anharmonicity.

17. The qubit of claim 15, further comprising a first terminal capacitively coupled to the qubit and a second terminal capacitively coupled to the second qubit.

18. The qubit of claim 15, wherein the second qubit comprises a transmon qubit.

19. The qubit of claim 18, wherein the transmon qubit is tunable.

20. A qubit comprising:
a capacitor;
a first Josephson junction in parallel with the capacitor; and
a plurality having a number N of second Josephson junctions in a series, the series of second Josephson junctions being in parallel with the capacitor and the first Josephson junction;
wherein the first Josephson junction has a junction energy that is a weight factor ε multiplied by a junction energy of one of the second Josephson junctions, and wherein F multiplied by N is less than 1,
further comprising a plurality of other, capacitively-coupled qubits to thereby provide a surface code free of unwanted ZZ interactions.

21. The qubit of claim 20, wherein the plurality of other qubits comprise at least one qubit according to claim 1.

22. The qubit of claim 20, wherein the plurality of other qubits comprise at least one transmon qubit.

* * * * *